US012609685B2

(12) United States Patent
Iyer et al.

(10) Patent No.: US 12,609,685 B2
(45) Date of Patent: Apr. 21, 2026

(54) CLOCK MODULATION SCHEMES IN INTEGRATED CIRCUITS

(71) Applicant: XILINX, INC., San Jose, CA (US)

(72) Inventors: Arun Iyer, Hyderabad (IN); Chirag Ravishankar, Erie, CO (US); Dinesh D. Gaitonde, Fremont, CA (US)

(73) Assignee: XILINX, INC., San Jose, CA (US)

( * ) Notice: Subject to any disclaimer, the term of this patent is extended or adjusted under 35 U.S.C. 154(b) by 51 days.

(21) Appl. No.: 18/416,837

(22) Filed: Jan. 18, 2024

(65) Prior Publication Data

US 2025/0240002 A1      Jul. 24, 2025

(51) Int. Cl.
*H03K 5/13* (2014.01)
*H03K 3/037* (2006.01)

(52) U.S. Cl.
CPC ............. *H03K 5/13* (2013.01); *H03K 3/0372* (2013.01)

(58) Field of Classification Search
CPC ............................... H03K 5/13; H03K 5/0372
See application file for complete search history.

(56) References Cited

U.S. PATENT DOCUMENTS

| | | | | |
|---|---|---|---|---|
| 7,408,393 B1 * | 8/2008 | Jain | ...................... | H03K 3/0372 |
| | | | | 327/202 |
| 7,843,218 B1 * | 11/2010 | Ramaraju | ...... | G01R 31/318541 |
| | | | | 326/46 |
| 9,641,161 B1 * | 5/2017 | Liu | ........................ | H10D 89/10 |
| 10,511,293 B2 * | 12/2019 | Seo | .................. | G01R 31/31727 |

OTHER PUBLICATIONS

Albrecht, C., et al., "Maximum mean weight cycle in a digraph and minimizing cycle time of a logic chip," Discrete Applied Mathematics, vol. 123, Issues 1-3, 2002, pp. 103-127.
Fishburn, J. P., "Clock skew optimization," in IEEE Transactions on Computers, vol. 39, No. 7, pp. 945-951, Jul. 1990.
Oklobdzija, V.G., et al. (2003). Digital System Clocking : High-Performance and Low-Power Aspects. IEEE.

* cited by examiner

*Primary Examiner* — Sibin Chen

(74) *Attorney, Agent, or Firm* — Patterson + Sheridan, LLP

(57) ABSTRACT

An integrated circuit (IC) includes a clock modulation circuitry including a delay hierarchy circuitry coupled to the register, the delay hierarchy circuitry configured to receive a clock (CLK) signal, provide a delayed master clock (CLKM) signal to a master latch of the register, and provide a delayed slave clock (CLKS) signal to a slave latch of the register.

17 Claims, 7 Drawing Sheets

CLOCK MODULATION SCHEMES IN INTEGRATED CIRCUITS

TECHNICAL FIELD

Examples of the present disclosure generally relate to a clock modulation circuitry for an integrated circuit (IC).

BACKGROUND

Integrated circuits (ICs), such as field programmable gate arrays (FPGAs), are becoming denser with every shrinking technology node by exploiting the gains that are coming from technology scaling. As ICs become denser, there is an expectation for their performance to improve at the same rate or better. However, most of the performance gains realized by technology scaling are restricted (limited) by clock uncertainty on timing paths of the circuit design such as clock jitter, clock skew, on-chip variation, and the like. The clock uncertainty is not scaling down with technology scaling and the improvement in circuit frequencies as observed in application-specific integrated circuits (ASICs) or programmable logic (PL). This makes it a challenge for circuit performance to scale at the same rate as technology without introducing area overhead. Therefore, there is a need in the art for improvement in the circuit and performance aspects of the programmable logic of the FPGA with each shrinking technology node.

SUMMARY

In one or more examples, an integrated circuit (IC) includes a register, a clock modulation circuitry including a delay hierarchy circuitry coupled to the register, the delay hierarchy circuitry configured to receive a clock (CLK) signal, provide a delayed master clock (CLKM) signal to a master latch of the register, and provide a delayed slave clock (CLKS) signal to a slave latch of the register.

In one or more examples, a delay hierarchy circuitry includes a first delay circuit having an input coupled to a clock (CLK) signal, a first selection circuitry having a first input coupled to the CLK signal, a second input coupled to an output of the first delay circuit, and an output coupled to a slave latch of a register, a second delay circuit having an input coupled to the output of the first selection circuitry; and a second selection circuitry having a first input coupled to the output of the first selection circuitry, a second input coupled to an output of the second delay circuit, and an output coupled to a master latch of the register.

In one or more examples a method for modulating a clock (CLK) signal of an integrated circuit (IC) includes receiving, by a delay hierarchy circuitry of a clock modulation circuitry, the CLK signal, providing, by the delay hierarchy circuitry, a delayed master clock (CLKM) signal to a master latch of a register of the IC; and providing, by the delay hierarchy circuitry, a delayed slave clock (CLKS) signal to a slave latch of the register.

DETAILED DESCRIPTION

Figure 1A:
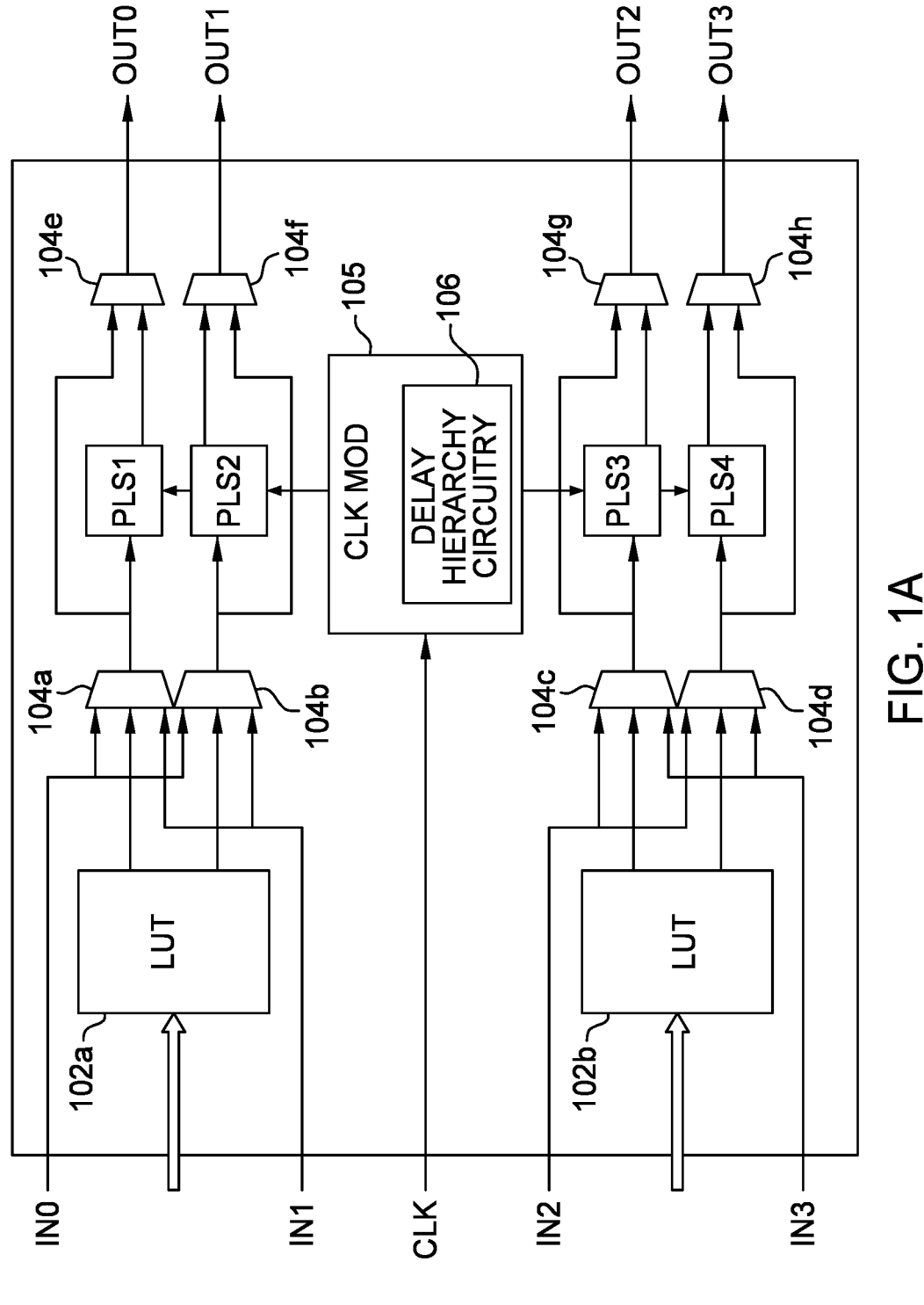
FIG. 1A illustrates an integrated circuit (IC) according to one or more examples.

Data pipelines of a circuit typically include registers, such as flip-flops, coupled in-series. Each register is a stage of the pipeline. The flip-flops are coupled by connecting an output pin (Q-pin) of one flip-flop to an input pin (D-pin) of a flip-flop of a next stage. In one example, the Q-pin of one flip-flop is directly connected to a D-pin of a flip-flop of a next stage. In another example, the Q-pin of one flip-flop is connected to a D-pin of a flip-flop of a next stage via intervening combinational logic circuitry. Each flip-flop also receives a clock signal on a clock pin. This forms data paths and timing paths, respectively, in the pipeline.

Typically, flip-flops are hard-edge triggered. Stated differently, flip-flops can toggle their outputs to match their inputs only when a positive (or negative) clock edge is received by a clock pin of said flip-flop. During static timing analysis, there is an expectation that the flip-flop receives a clock signal (i.e., a rising or falling clock-edge depending if the flip-flop is positive or negative edge triggered) at a specific time with respect to when data is received on the flip-flop's data pin. However, the clock edge arriving at a specific time with respect to the data might not be guaranteed due to delays on each of the clock paths and data paths of a pipeline. For example, due to clock design constraints, and clock uncertainties, such as clock jitter, local clock uncertainties, clock skew, and the like, the clock edge may arrive early or late causing timing violations. In reality there is a window of time in which a clock edge may arrive.

Master-slave flip-flops include a master latch and a slave latch. The slave latch includes a slave clock pin that receives a slave clock signal (CLKS). The master latch includes a master clock pin that receives a master clock signal (CLKM). For example, for a rising edge master-slave flip-flop, the master clock signal is an inverted (negative) clock signal of the slave clock signal. Thus, the slave clock signal is a non-inverted clock signal. For a falling edge master-slave flip-flop, the slave clock signal is an inverted clock signal of the master clock signal, and the master clock signal is a non-inverted clock signal. At an edge of the clock signal, for example when the slave clock signal changes from low to high and the master clock signal changes from high to low, the master latch closes, the slave latch opens, and the data output of the flip-flop changes to match the data input of the flip-flop. However, as described above, the master-slave flip-flop is hard-edge triggered.

In one example, to account for early and late clock arrivals, the master clock signal provided to the master latch can be delayed using a delay circuit, forming a soft-edge flip-flop. This allows clock uncertainties to be recovered by the flip-flop. Stated differently, delaying the master clock signal allows for the master latch to close at a period of time after the slave latch opens. Delaying the master clock signal allows the flip-flop to behave as a latch for a fixed period of time. Delaying the master clock signal forms a fixed transparent window in which the output of the flip-flop can be toggled based on changes in the data received at the input pin. As understood by those with ordinary skill in the art a transparency window (or when a register is transparent) is a period of time in which the output of a register follows (i.e., matches) the input of the register.

Unlike conventional latches, which are transparent for an entire phase of the clock signal, soft-edge flip-flops have a transparency window that is limited by the delay added to the master clock signal.

In static timing analysis, there are setup and hold timing checks performed on each synchronous path. A setup check requires for the data path delay (which includes clock to Q of the source, and combinational delay through logic leading to the D pin of the destination synchronous element) to arrive prior to the setup requirement window of the destination flop. The arrival time of clocks at each of the synchronous elements can vary and needs to be accounted in the calculation. Finally, slack is computed based on the amount of extra available time for the data path to arrive prior to the setup requirement. Slack can be a negative value indicating that the data arrives after the setup requirement, therefore violating the setup check. A similar check is performed for hold, where the data needs to be held constant for a period of time (i.e. hold requirement) after the clock arrival at the destination In another example, a delay can be added to both the slave latch and the master latch of the master-slave flip-flop, forming a time-borrowing master-slave flip-flop. Stated differently, time-borrowing master-slave flip-flop allows a first data path (a data path having an end point at the D-pin of the flip-flop) to borrow time from a second data path (a data path having a start point at the Q-pin of the flip-flop). However, the downside to borrowing time is that the slack time on the second data path is degraded on a next timing cycle. Clock uncertainties on timing paths further contribute to the degradation of slack times of data paths. For example, if the second data path is critical (i.e., the delays on the second data path are greater than the clock signal period and the required set-up time of the flip-flop) then the flip-flop cannot and should not borrow time from the second data path. If the second data path is critical, but time is still borrowed for first data path, the second data path will fail to meet its timing requirement.

Even though conventional latches or latches that are transparent for a full phase of a clock pulse (i.e., when the clock pulse is high for a high-phase latch and low for a low-phase latch) are able to borrow time as needed, modeling the registers as latches in static timing analysis software is cumbersome. Normally, design flows can handle latches. Latches need to be explicitly instantiated in the static timing analysis software and the cells of the latch need to have proper latch like definitions defined in the timing model used by the design flow. Thus, latch models in static timing analysis are extremely cumbersome for the design flow to handle because they create multiple timing loops and sequential feedthrough paths which lead to significant increase in analysis runtimes and memory requirements, and complications in optimizations. Due to these overheads, design flows do not work well/efficiently with latch-based modeling. Furthermore, static timing analysis software models dynamic time borrowing registers (e.g., pulsed latches and soft-edge flip-flops) as regular flip-flops. The problem with modeling registers as regular flip-flops is that the transparency window must be modeled as a fixed increase in time from the clock pin to the output pin of the flip-flop. The fixed increase will always penalize the second data path. Therefore, if both the first data path and the second data paths are critical, then the circuit is limited by either the first data path or the second data path. This restriction to modeling registers as regular flip-flops negates the potential benefits provided by the soft-edge flip-flops.

Additionally, there is an underlying pessimism in static timing analysis, if there are back-to-back timing paths and the registers are modeled as flip-flops, the timing uncertainty on each timing path is accounted for independently (path-by-path), and hence, is double counted.

Embodiments herein relate to a clock modulation circuitry that modulates a clock signal and allows designs to tolerate clock uncertainty to the full extent required while providing flexibility to time borrowing while modeling the registers as flip-flops and exploiting the underlying pessimism in static timing analysis. In particular, embodiments herein relate to a delay hierarchy circuitry of a clock modulation circuitry that includes a first delay control circuitry and a second delay control circuitry. The first delay control circuitry outputs a slave clock signal to a slave latch of a master-slave flip-flop. The second delay control circuitry outputs a master clock signal to a master latch of the master-slave flip-flop.

In one example, the first delay control circuitry adds a first delay to the slave clock signal and the second delay control circuitry adds a second delay to the master clock signal if a data path having a start point on an output pin of the master-slave flip-flop is not critical (i.e., includes slack) and the first delay and the second delay do not violate a hold requirement of the master-slave flip-flop. Advantageously, this allows the master-slave flip-flop to act as both a soft-edge and time borrow master-slave flip-flop. This allows a data path having an endpoint on the input pin of the flip-flop to borrow time and recover clock uncertainties.

On the other hand, if the data path having a start point on an output pin of the master-slave flip-flop is critical (i.e., does not have sufficient timing slack) the second delay circuitry only delays the master clock signal as long as the second delay does not violate a hold requirement of the master-slave flip-flop. This allows the master-slave flip-flop to behave as a soft-edge flip-flop, and allows the data path having an endpoint on the input pin of the flip-flop to improve its timing by recovering clock uncertainties without degrading (borrowing time) from the data path having a start point on the output pin of the master-slave flip-flop. Stated differently, the clock modulation circuitry allows for a master-slave flip-flop to be used as a soft-edge flip-flop and/or time borrow master-slave flip-flop based on the criticalities of data paths, thus improving the frequency and power of a circuit design.

FIG. 1A illustrates a schematic diagram of an example IC 100 according to one or more examples. In one or more examples, the IC 100 is a field programmable gate array (FPGA) that implements programmable logic (PL), but the embodiments herein can be used with any IC that uses the flip-flop structure described below. In one example, the IC 100 includes a first look-up table (LUT) circuitry 102a, a second look up table (LUT) circuitry 102b, a first stage of multiplexers including a first multiplexer 104a, a second multiplexer 104b, a third multiplexer 104c, and a fourth multiplexer 104d, a second stage of multiplexers including a fifth multiplexer 104e, a sixth multiplexer 104f, a seventh multiplexer 104g, and an eighth multiplexer 104h, a first pipeline startpoint PLS1, a second pipeline startpoint PLS2, a third pipeline startpoint PLS3, and a fourth pipeline startpoint PLS4. As understood by those with ordinary skill in the art, each pipeline includes at least two pipeline stages that comprise registers coupled in series. Thus, each pipeline startpoint includes a register. This will be described in more detail below. Even though the IC 100 is illustrated as having two LUT circuitries, this is for example purposes only, and the IC 100 may include any quantity of LUT circuitries. Also even though the IC 100 is illustrated as including four pipelines, this is for example purposes only, the quantity of pipelines is not limited.

The first LUT circuitry 102a and the second LUT circuitry 102b each receive an input from other registers, memories, or functional blocks present within the PL or outside of the PL Based on the received input, the first LUT circuitry 102a provides an output to the first multiplexer 104a and the second multiplexer 104b. The second LUT circuitry 102b provides an output to the third multiplexer 104c and the fourth multiplexer 104d. In one example, the first multiplexer 104a, the second multiplexer 104b, the third multiplexer 104c, and the fourth multiplexer 104d are three-to-one multiplexers. Although the first stage of multiplexers is illustrated as having four three-to-one multiplexers, this is for example purposes only. The first stage of multiplexers may include any quantity of multiplexers having any configuration of inputs to outputs.

The first stage of multiplexers are configured to provide a same output to a corresponding pipeline and a corresponding multiplexer of the second stage of multiplexers. Therefore, each multiplexer of the second stage of multiplexers are two-to-one multiplexers. Although the second stage of multiplexers are illustrated as having four two-to-one multiplexers, this is for example purposes only. The second stage of multiplexers may include any quantity of multiplexers having any configuration of inputs to outputs.

The first multiplexer 104a receives the output from the first LUT circuitry 102a, a first data input IN0 and a second data input IN1. The first multiplexer 104a outputs one of: the output from the first LUT circuitry 102a, the first data input IN0, or the second data input IN1 to the first pipeline PL1 and the fifth multiplexer 104e. The second multiplexer 104b receives the output from the first LUT circuitry 102a, the first data input IN0, and the second data input IN1. The second multiplexer 104b outputs one of: the output from the first LUT circuitry 102a, the first data input IN0, or the second data input IN1 to the second pipeline PL2 and the sixth multiplexer 104f.

The third multiplexer 104c receives the output from the second LUT circuitry 102b, a third data input IN2 and a fourth data input IN3. The third multiplexer 104c outputs one of: the output from the second LUT circuitry 102b, the third data input IN2, or the fourth data input IN3 to the third pipeline PL3 and the seventh multiplexer 104g. The fourth multiplexer 104d receives the output from the second LUT circuitry 102b, the third data input IN2, and the fourth data input IN3. The fourth multiplexer 104d outputs one of: the output from the second LUT circuitry 102b, the third data input IN2, or the fourth data input IN3 to fourth pipeline PL4 and the eighth multiplexer 104h.

Each pipeline provides an output to a corresponding multiplexer of the second stage of multiplexers. The first pipeline PL1 provides an output to the fifth multiplexer 104e. The second pipeline PL2 provides an output to the sixth multiplexer 104f. The third pipeline PL3 provides an output to the seventh multiplexer 104g. The fourth pipeline PL4 provides an output to the eighth multiplexer 104h.

Each multiplexer of the second stage of multiplexers output either the output from a corresponding pipeline stage or the output a corresponding multiplexer of the first stage of multiplexers as an output of the IC 100. The fifth multiplexer 104e outputs either the output from the first pipeline PL1 or the first multiplexer 104a as a first output OUT0. The sixth multiplexer 104f outputs either the output from the second pipeline PL2 or the second multiplexer 104b as a second output OUT1. The seventh multiplexer 104g outputs either the output from the third pipeline PL3 or the third multiplexer 104c as a third output OUT2. The eighth multiplexer 104h outputs either the output from the fourth pipeline PL4 or the fourth multiplexer 104d as a fourth output OUT3.

Figure 1B:
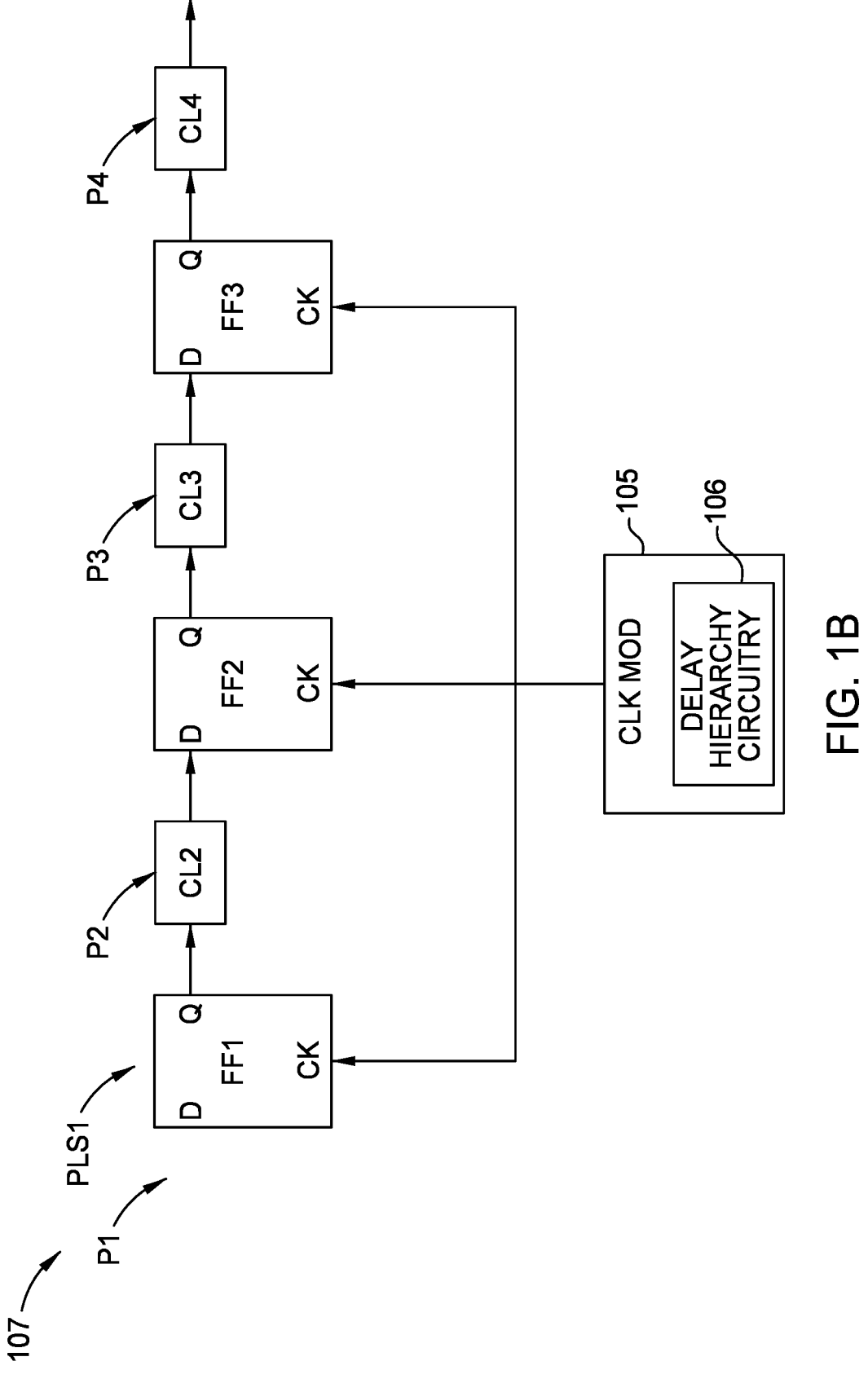
FIG. 1B illustrates an example pipeline included in the IC design of FIG. 1A according to one or more examples.

As described above, pipelines typically include stages that each comprise a register, such as a flip-flop. Stages are connected to one another by coupling the registers in-series. FIG. 1B illustrates an example pipeline according to one or more embodiments. In one example, FIG. 1B illustrates a first pipeline 107 having a start point PLS1. For example, the first pipeline 107 is a two stage pipeline, so it includes three flip-flops (registers) including a first flip-flop FF1 corresponding to the first pipeline startpoint PLS1. Each of the flip-flops are coupled in series. For example, an output pin (Q-pin) of each flip-flop is coupled to an input pin (D-pin) next flip-flop. For example, a first data path P1 is formed between the first multiplexer 104a (FIG. 1A) and the D-pin of a first flip-flop FF1. A second data path P2 is formed between the Q-pin of the first flip-flop FF1 and the D-pin of a second flip-flop FF2. A third data path P3 is formed between the Q-pin of the second flip-flop FF2 and the D-pin of a third flip-flop FF3. A fourth data path P4 is formed between the Q-pin of the third flip-flop FF3 and the fifth multiplexer 104e (FIG. 1A). As understood by those with ordinary skill in the art, each data path includes intervening combinational logic circuitry. For example a first combinational logic circuitry CL1 is included between the Q-pin of the first flip-flop FF1 and the D-pin of the second flip-flop FF2. A second combinational logic circuitry CL2 is coupled between Q-pin of the second flip-flop FF2 and the D-pin of the third flip-flop FF3. A third combinational logic circuitry CL3 is coupled between the Q-pin of the third flip-flop FF3 and the fifth multiplexer 104e (FIG. 1A). In another example, the registers included in each pipeline may be pulsed latches or other types of registers.

In one example, each of the clock (CK) pins of each flip-flop of each pipeline are coupled to the delay hierarchy circuitry 106 of the clock modulation (CLK MOD) circuitry 105. The delay hierarchy circuitry 106 receives a clock signal CLK and outputs a delay hierarchy circuitry clock signal to the clock (CK) pins of each flip-flop (FIG. 1A). Therefore, a timing path is formed between each CK pin of each flip-flop and the delay hierarchy circuitry 106. In one example, the delay hierarchy circuitry 106 is coupled to each CK pin of each flip-flop (or register) of each pipeline stage. In another example, the CLK MOD circuitry 105 includes individual delay hierarchy circuitries coupled to each register of each pipeline stage. In another example, each flip-flop is coupled to a separate CLK MOD circuitry.

Solutions to mitigate restrictions caused by uncertainties of timing paths that have been used to improve performance include using pulsed latches with a fixed amount of transparency, flip-flips with a fixed amount of transparency, and latch based designs as registers. Using pulsed latches, flip-flops with a fixed amount of transparency, and latch based designs are not fit for PL because they are based on knowledge of timing path criticality that is not available or possible for PL. When implementing flip-flips with a fixed amount of transparency and latch based designs either all end points of paths need to support them and pay a significant penalty in area/power time overhead or none of the paths need to support these features. Additionally, it is difficult to model flip-flips with a fixed amount of transparency, and latch based designs in static timing analysis software. However, using clock modulation-based skewing/time-borrowing is a viable solution for PL because it can be configurable based on how timing paths are distributed within a circuit design and can be easily implemented in static timing analysis software.

Alternatively, even though the IC 100 is described as a FPGA that implements PL, the CLK MOD circuitry 105 may be implemented on application-specific integrated circuit (ASIC) or any other circuit that does not include PL.

Figure 4:
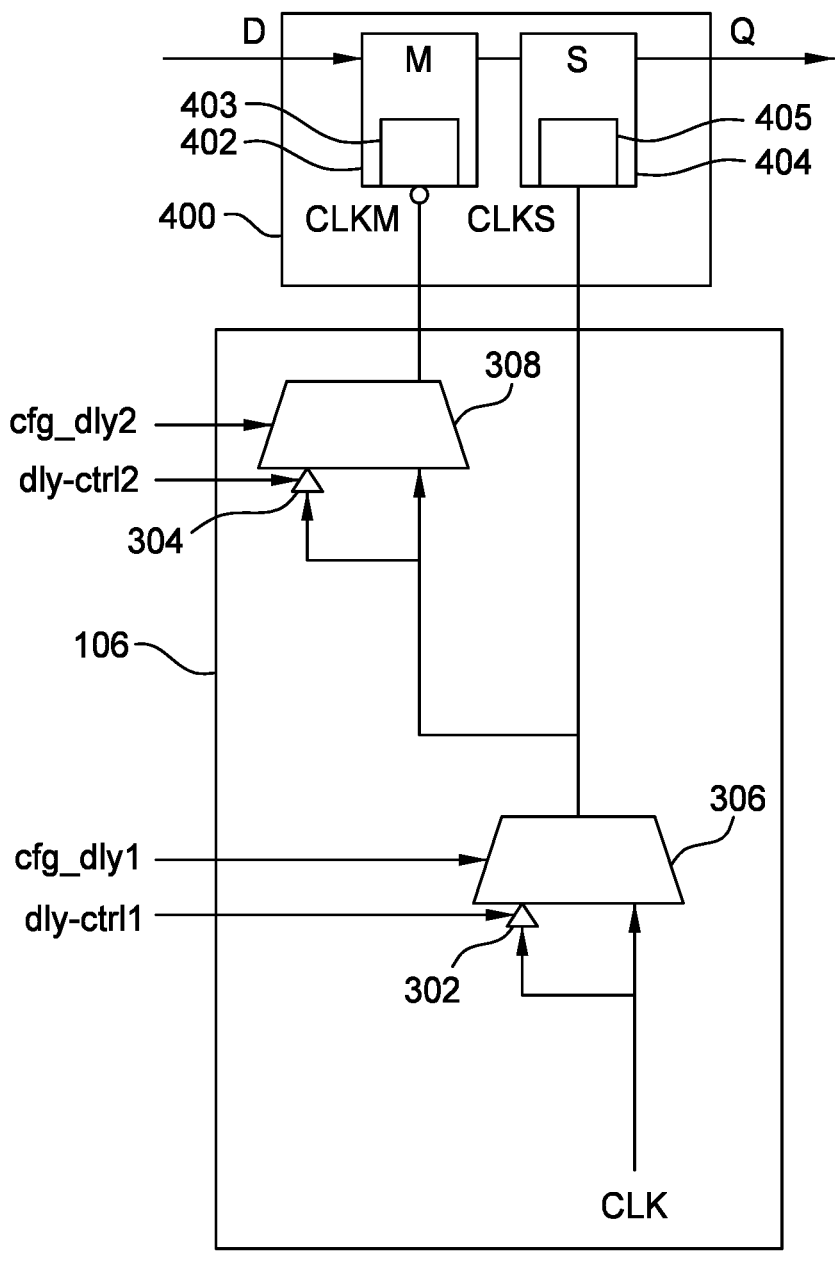
FIG. 4 illustrates a schematic diagram of an example master-slave flip-flop coupled to the delay hierarchy circuitry of the clock modulation (CLK MOD) circuitry shown in FIG. 3 according to one or more examples.

In one example, each of the flip-flops, such as FF1-FF3 are master-slave flip-flops having a master (M) latch 402 and a slave(S) latch 404 (FIG. 4). The clock signal from the from the delay hierarchy circuitry 106 includes a master clock signal (CLKM) that is provided to a master clock pin 403 the master (M) latch 402 of each flip-flop and a slave clock signal (CLKS) that is provided to a slave clock pin 405 of each slave(S) latch 404 of each flip-flop (FIG. 4). This is described in more detail below.

As described above, in static timing analysis software, the dynamic time borrowing circuits are treated as regular flip-flops, and it is cumbersome to model regular latches. Advantageously, the CLK MOD circuitry 105 includes the delay hierarchy circuitry 106. The delay hierarchy circuitry 106 eliminates the restriction caused by back-to-back critical paths while modeling the registers as flip-flops. Stated differently the delay hierarchy circuitry 106, provides a way to model adaptive circuits (e.g., soft-edge latches, time borrow master-slave flip-flops, and pulsed latches) without any overheads and exploits (i.e., recovers) an underlying pessimism in static timing analysis. This will be described in more detail below.

Figure 2A:
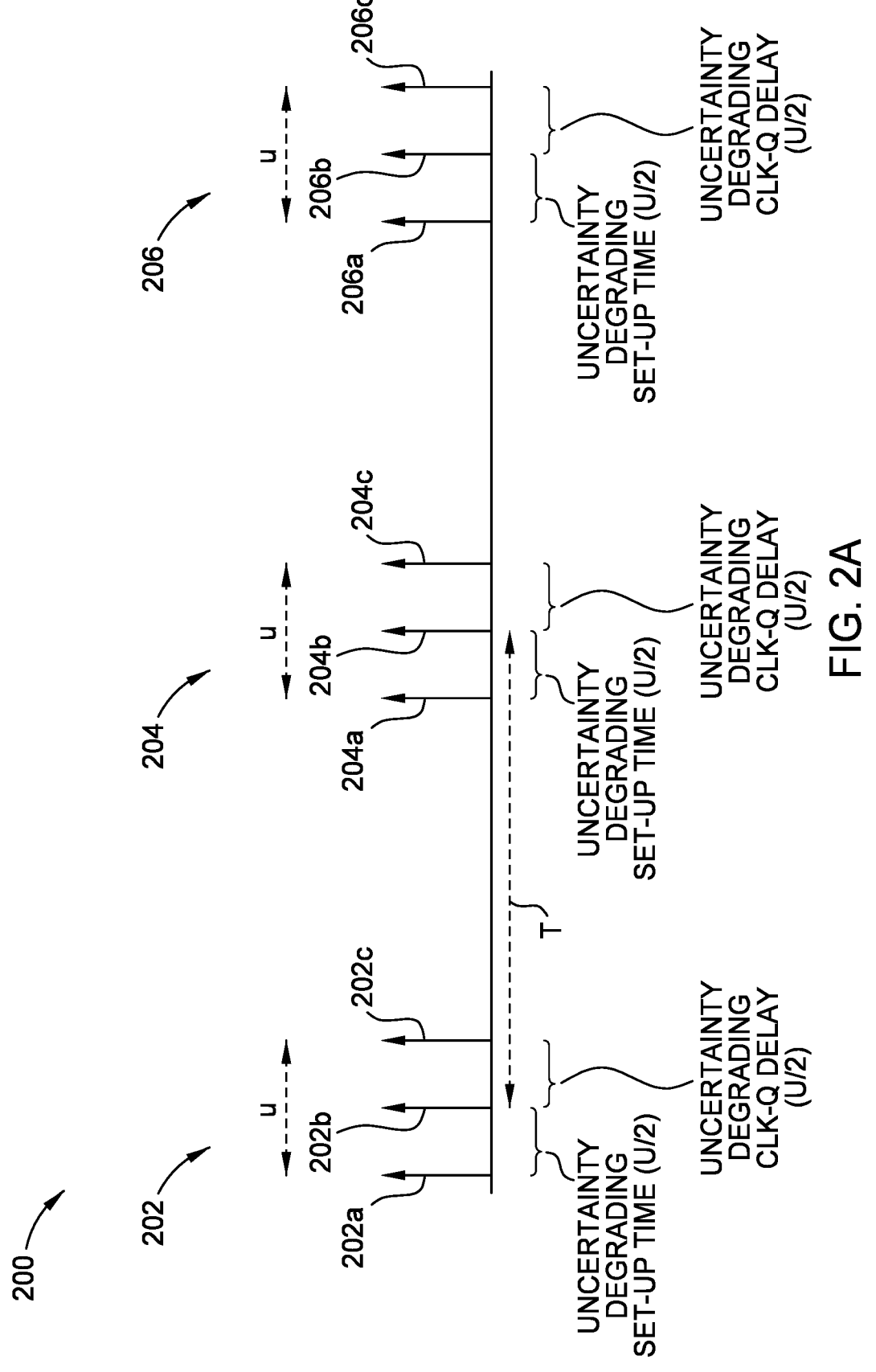
FIG. 2A illustrates a clock arrival timing diagram for an example pipeline shown in FIG. 1B, according to one or more examples.

FIG. 2A illustrates a clock arrival timing diagram 200 for an example pipeline shown in FIG. 1B, according to one or more examples. For illustrative purposes only, here, each register is treated as a regular flip-flop that receives a same clock signal. FIG. 2A illustrates three sets of clock arrivals. A first set of clock arrivals 202 includes potential clock arrivals for the first flip-flop FF1. A second set of clock arrivals 204 includes potential clock arrivals for the second flip-flop FF2. A third set of clock arrival 206 includes potential clock arrivals for the second flip-flop FF3. As noted above a clock arrival is defined herein as when a clock edge reaches the clock pin of a flip-flop (or register). The first set of clock arrivals 202 includes an on-time clock arrival 202*b*, an early clock arrival 202*a*, and a late clock arrival 202*c*. The second set of clock arrivals 204 includes an on-time clock arrival 204*b*, an early clock arrival 204*a*, and a late clock arrival 204*c*. The third set of clock arrivals 206 includes an on-time clock arrival 206*b*, an early clock arrival 206*a*, and a late clock arrival 206*c*.

In synchronous designs, the frequency of the design is determined at least by the data path delays caused by at least the combinational logic circuitries (CL1-CL2), clock skews between the start point and endpoint of timing paths (FIG. 1B), and clock uncertainties. The effective cycle time for a timing path is defined herein as the time period available to perform computations between two interacting flip-flops or registers. The effective cycle time for a timing path is defined as the clock period (T) minus any clock uncertainties. The clock uncertainties include the cumulative effects of clock jitter, effects of crosstalk on the clock period and clock delays, on-chip-variation (OCV) effects on the clock path delays and IR drop (i.e., the voltage drop due to impedance of the power grid supplying power supply to the logic circuits) effect on the clock path delays and data path delays.

As described above, an early clock arrival or a late clock arrival is caused by clock uncertainties. Assuming that it is equally likely for a clock signal to arrive early or late, the total possible clock uncertainty (i.e., the largest clock uncertainty) for each flip-flop is equal to U, because as shown, an early clock degrades set-up time of a flip-flop by U/2 and a late clock degrades clock to Q-pin delay for each flip-flop by U/2.

Figure 2B:
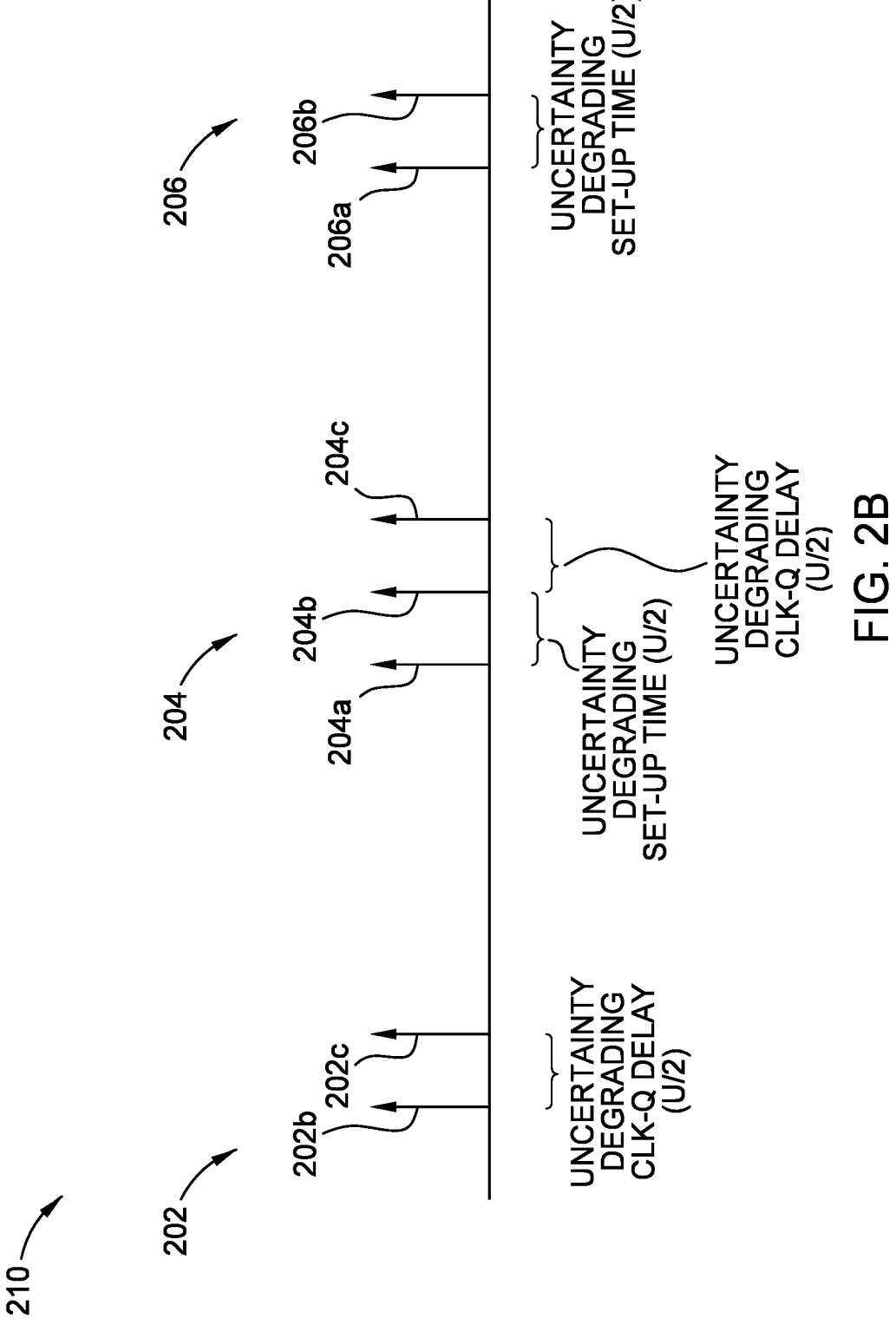
FIG. 2B illustrates a timing diagram illustrating an example worst case scenario for clock arrivals on the pipeline shown in FIG. 1B, according to one or more examples.

In order to determine the possible arrival of the clock signal, the worst case scenarios are analyzed path-by path. FIG. 2B illustrates an example worst case scenario 210 for clock arrivals on the pipeline shown in FIG. 1B, according to one or more examples.

In one example, the worst case scenario for clock arrivals would be when a clock arrives as late as possible on a driving flop, and when a clock arrives as early as possible on a receiving flop. Alternatively, another worst case scenario would be when a clock arrives as early as possible on a driving flip-flop and as late as possible on a receiving flip-flop. For example, referring to the first pipeline 107 (FIG. 1B) a worst case scenario for the second data path P2 would be that the clock arrival on the first flip-flop FF1, which drives the second flip-flop FF2, is as late as possible (i.e. late arrival 202C) and the clock arrival on the second flip-flop FF2 is as early as possible (i.e. early clock arrival 204*a*) or vice versa. The worst case scenario for the third data path P3 would be that the clock arrival on the second flip-flop FF2 is as late as possible (i.e., late clock arrival 204*c*) and the clock arrival on the third flip-flop FF3 is as early as possible (i.e., early clock arrival 206*a*) or vice versa.

With respect to the worst case scenario for the second data path P2, the uncertainty is equal to U/2 due to the late clock arrival 202*c* on the first flip-flop FF1 plus U/2 due to the early clock arrival 204*a* on the second flip-flop FF2. Therefore, the largest amount of uncertainty on the second data path P2 is equal to U. Similarly, for the worst case scenario for the third data path P3, the uncertainty is equal to U/2 due to the late clock arrival 204*c* on the second flip-flop FF2 plus U/2 due to the early clock arrival 206*a* on the third flip-flop FF2.

Problematically, during static timing analysis, the uncertainty for the pipelines are an accumulation of the worst case scenario of each data path. Therefore, in the described example, the overall uncertainty for the second data path P2 and the third data path P3 is typically determined as equal to 2U. However, the clock arrival cannot be late and early to the same register simultaneously. For example, the clock arrival cannot be early and late to the second flip-flop FF2 at the same time. Thus, there is an unnecessary pessimism built into static timing analysis. Advantageously embodiments herein, include CLK MOD circuitry 105 that can exploit and recover said pessimism. For example, because the clock arrival cannot be late and early to the second flip-flop FF2, the uncertainty of the third data path P3 can be recovered. This is because the actual overall uncertainty between the second data path P2 and the third data path P3 is equal to U, not 2U. Therefore, the third data path P3 includes a recoverable uncertainty equal to U. Stated differently, using the CLK MOD circuitry 105, the extra pessimism (unused uncertainty) can be recovered, and used to fix the timing of the second data path P2 without borrowing time (degrading) the third data path P3 even if both data paths are critical.

Figure 3:
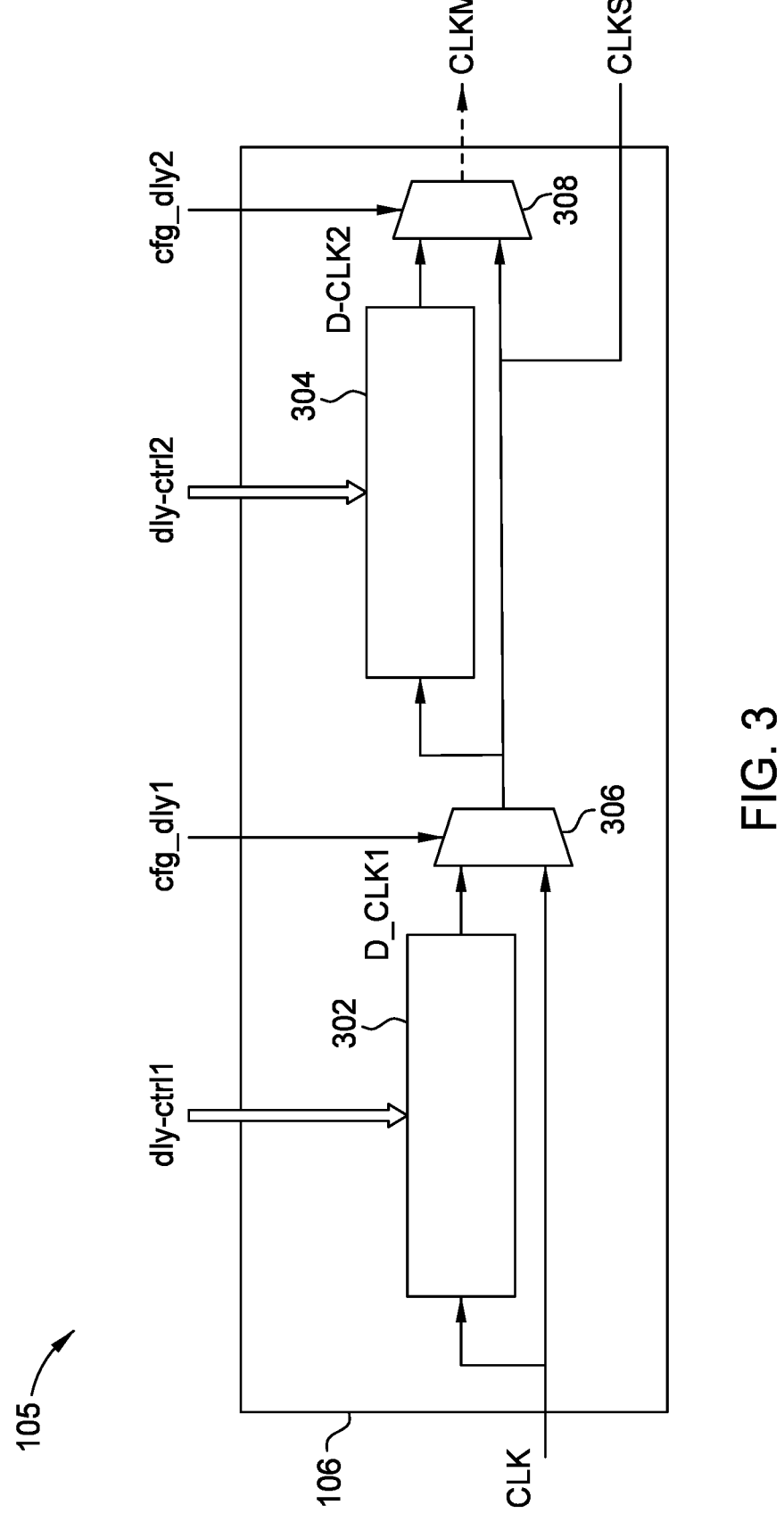
FIG. 3 illustrates a schematic diagram of the delay hierarchy circuitry of a clock modulation (CLK MOD) circuitry according to one or more examples.

FIG. 3 illustrates a schematic diagram of the delay hierarchy circuitry 106 of a clock modulation (CLK MOD) circuitry 105 according to one or more examples. FIG. 4 illustrates a schematic diagram of an example master-slave flip-flop 400, such as the second flip-flop FF2 (FIG. 1B), coupled to the delay hierarchy circuitry 106 of a clock modulation (CLK MOD) circuitry 105 according to one or more examples. In one example, as described above, the second flip-flop FF2 is a master-slave flip-flop including a master (M) latch 402 and a slave(S) latch 404 (FIG. 4). The master (M) latch 402 includes a master clock pin 403 configured to receive a master clock signal CLKM (FIG. 4). The slave(S) latch 404 includes a slave clock pin 405 configured to receive a slave clock signal CLKS (FIG. 4).

In one example, the delay hierarchy circuitry 106 includes a first delay circuit 302, a second delay circuit 304, a first delay control circuitry 306, and a second delay control circuitry 308. In one or more examples, the first delay circuit 302 and the second delay circuit 304 include more than one delay circuit. In one example, the first delay circuit 302 and the second delay circuit 304 are programmable delay circuits in which the amount of delay is programmed by the static timing analysis software. The quantity of delay circuits included in the first delay circuit 302 and the second delay circuit 304 may be the same or different. In one example, the first delay control circuitry 306 and the second delay control circuitry 308 are multiplexers. For example, the first delay control circuitry 306 and the second delay control circuitry 308 are 2:1 multiplexers. The first delay circuit 302 receives the clock signal CLK (FIG. 1A) and delays the clock signal CLK by a first delay, outputs a first delayed clock signal D_CLK1, and provides the first delayed clock signal D_CLK1 to the first delay control circuitry 306. The value of the first delay is determined by via the static timing analysis software and is set via a first delay control signal dly_ctrl1.

The first delay control circuitry 306 receives the first delayed clock signal D_CLK1 from the first delay circuit 302, the clock signal CLK, and a first configuration signal cfg_dly1. In one example, the first configuration signal cfg_dly1 is controlled by the static timing analysis software. Based on the first configuration delay signal cfg_dly1, the first delay control circuitry 306 outputs either the first delayed clock signal D_CLK1 or the clock signal CLK as a first delay control circuitry output signal. If the first configuration delay signal cfg_dly1 is enabled, the first delay control circuitry 306 outputs the first delayed clock signal D_CLK1 as the first delay control circuitry output signal. If the first configuration delay signal cfg_dly1 is disabled, the first delay control circuitry 306 outputs the clock signal CLK as the first delay control circuitry output signal (or vice versa). The first delay control circuitry output signal is provided to both the second delay circuit 304 and the slave clock pin 405 of the slave(S) latch 404 as the slave clock signal CLKS (FIG. 4).

The second delay circuit 304 receives the first delay control circuitry output signal and adds an additional delay to the first delay control circuitry output signal equal to a second delay, generating a second delayed clock signal D_CLK2. The second delay circuit 304 provides the second delayed clock signal D_CLK2 to a second delay control circuitry 308. The value of the second delay is determined by the static timing analysis software and is configured using a second delay control signal dly_ctrl2. The second delay control circuitry 308 is configured to receive the second delayed clock signal D_clk2, the first delay control circuitry output signal, and a second delay configuration signal cfg_dly2. In one example, the second configuration signal cfg_dly2 is controlled by the static timing analysis software. Based on the second configuration signal cfg_dly2, the second delay control circuitry 308 outputs either the second delayed clock signal D_CLK2 or the first delay control circuitry output signal. If the second configuration delay signal cfg_dly2 is enabled, the second delay control circuitry 308 outputs the second delayed clock signal D_CLK2. If the second configuration delay signal cfg_dly2 is disabled, the second delay control circuitry 308 outputs the first delay control circuitry output signal (or vice versa). The output of the second delay control circuitry 308 is provided as the CLKM signal to a master clock pin 403 of the master (M) latch 402 of the master-slave flip-flop 400 (FIG. 4).

As explained above, due to data path delays and clock uncertainties, there is a timing window in which the clock can arrive to a register (i.e., a flip-flop). In one example, the size of the timing window is equal to the clock uncertainties. As described above, adding a delay to the CLKM signal is used to form a soft-edge flip-flop. Adding different delays to the CLKS and CLKM signals is used to form a time-borrowing flip-flop. Adding equal delays to the CLKS and CLKM signals are used to cause the register to behave as a regular flip-flop shifted in time. Advantageously, instead of using a single delay, the delay is split into the first delay and the second delay. Therefore, flip-flops in each pipeline are configurable by the CLK MOD circuitry 105 and can be configured as soft-edge flip-flops to recover uncertainties without time borrowing (if both paths are critical), a time-shifted regular flip-flop, or as soft-edge time borrowing flip-flops to recover uncertainties and borrow time from the downstream data path. Stated differently, the CLK MOD circuitry 105 can configure each flip-flop of each pipeline based on the criticalities of the data paths.

As noted above, the delay hierarchy circuitry 106 may be coupled to each flip-flop (or other type of register) of each pipeline of an IC device or a separate delay hierarchy circuitry 106 may be coupled to each flip-flop (or other type of register) and configure each flip-flop individually.

The delays added to the CLKS signal and the CLKM signal are configurable, and are controlled using the first configuration signal cfg_dly1 and the second configuration signal cfg_dly2, respectively. Both configuration signals are controlled based on characteristics of the IC 100 such as whether a downstream (i.e., next) data path having a start point on an output pin (Q-pin) of a flip-flop (register), such as the third data path P3 (FIG. 1B), is critical whether said the path can borrow time and/or recover clock uncertainties without violating a hold requirement of a corresponding register, and, in some cases, the IC 100 (FIG. 1A).

Figure 5:
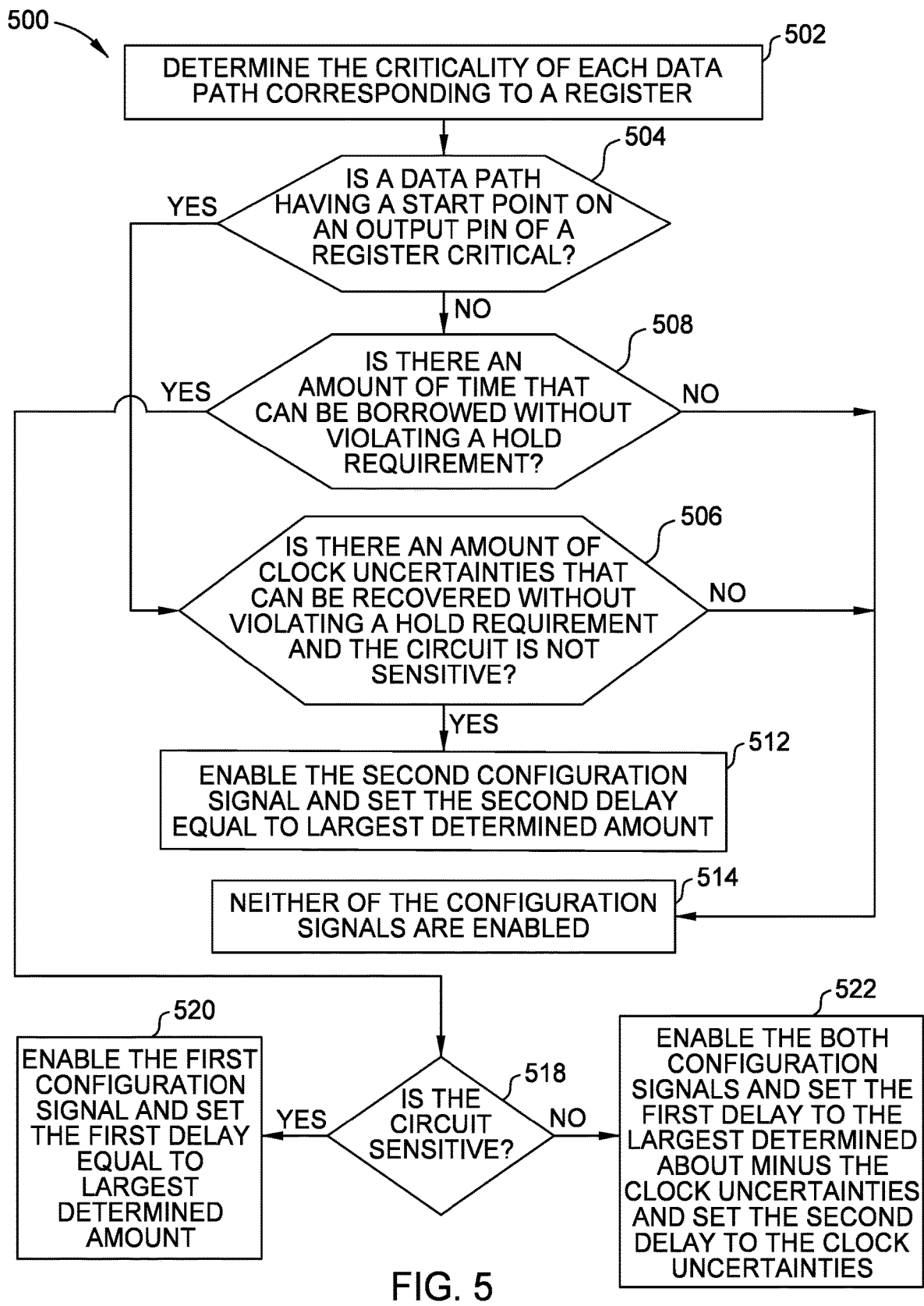
FIG. 5 illustrates a method for modulating a clock signal of an IC using a clock modulation circuitry (CLK MOD) according to one or more examples.

FIG. 5 illustrates a method for modulating a clock signal of an IC using a clock modulation (CLK MOD) circuitry 105 according to one or more examples.

At operation 502 of method 500, a static timing analysis application (e.g., a software application that is executed by one or more processors) determines the criticality of each data path of corresponding to a register of an IC 100 (FIG. 1A. As noted above, each flip-flop (or register) in a pipeline corresponds to two data paths. For example the second data path P2 and the third data path P3 both correspond to the second flip-flop FF2 (FIG. 1B).

The static timing analysis application can determine whether a data path is critical based on the delay of the data path, the clock period (i.e., the period of the clock signal CLK), the set-up time of the flip-flop, and the clock skew (i.e., the relative delay between the arrival times on the clock between the source and the destination flip-flops). If the delay of the data path is greater than the clock period minus the set-up time of the flip-flop then the data path is critical. On the other hand, if the delay of the data path is less than the clock period minus the set-up time of the flip-flop then the data path is not critical. Although the operations of method 500 will be described with reference to the second data path P2, it is understood the steps of method 500 are performed for each data path of each pipeline of the IC 100.

At operation 504, of method 500, the static timing analysis application determines whether a next data path having a start point on an output pin of a flip-flop (register) is critical. For example, the static timing analysis application determines whether the third data path P3 is critical. For example, if the delay of the third data path P3 is greater than the clock period minus the set-up time of the second flip-flop FF2, the third data path P3 is critical (or vice versa). If the third data path P3 (i.e., the next data path) is critical, the second data path P2 (i.e., the current data path) cannot borrow time from the third data path P3 and can only recover clock uncertainties. Stated differently, the first configuration signal cfg_dly1 cannot be enabled. If the third data path P3 is critical, the method proceeds to operation 506 and the static timing analysis application determines whether there is an amount of clock uncertainties that can be recovered by the second data path P2 without violating a hold requirement of the second flip-flop FF2 (i.e., the corresponding register) and whether the IC 100 is sensitive.

On the other hand, if the third data path P3 is not critical, then the third data path P3 includes slack that can be potentially be borrowed by the second data path P2. If the third data path P3 is not critical, the method 500 proceeds to operation 508 and the static timing analysis application determines whether there is an amount of time that can be borrowed by the second data path P2 without violating a hold requirement of the second flip-flop FF2.

At operation 506 of method 500, the static timing analysis application determines if there is an amount of clock uncertainties that can be recovered by the second data path P2 without violating a hold requirement of the second flip-flop FF2 and whether the IC 100 is sensitive. For example, if the third data path P3 is critical, even though the second data path P2 cannot borrow time, it can still recover clock uncertainties. However, the second data path can only recover clock uncertainties if doing so does not violate a hold requirement of the second flip-flop FF2 and the IC 100 is not sensitive. As described above to recover clock uncertainties the static timing analysis software can delay the CLKM signal of the second flip-flop FF2. As noted above largest amount of clock uncertainties that can be recovered is U. Therefore, at operation 506, the static timing analysis software determines whether the CLKM signal provided to the second flip-flop FF2 can be delayed by an amount of time between 0 and U without violating a hold requirement of the second flip-flop FF2. If the static timing analysis software determines that there are clock uncertainties that can be recovered by the second data path P2, the static timing analysis application checks whether the IC 100 is sensitive. If the IC 100 is not sensitive, the method 500 proceeds to block 512 and the second configuration signal cfg_dly2 is enabled (delaying the CLKM signal) and the second delay is set to the largest possible amount of clock uncertainties that can be recovered by the second data path P2. If the IC 100 is sensitive, timing uncertainties cannot be recovered and the method proceeds to operation 514 and neither of the configuration signals (cfg_dly1 and cfg_dly2) are enabled.

For example, if the static timing analysis application determines that the CLKM signal of the second flip-flop FF2 can be delayed between amount(s) of time between 0 and U without violating a hold requirement of the second flip-flop FF2 and the IC 100 is not sensitive, the static timing analysis application sets the second delay equal to the largest determined amount of time between 0 and U that does not violate a hold requirement of the second flip-flop FF2 via the second delay signal crtl_dly2, and enables the second configuration signal cfg_dly2. Enabling the second configuration signal cfg_dly2 delays the CLKM signal by the second delay, and allows for the recovery of clock uncertainties without borrowing time. This forms a transparency window in which the master (M) latch 402 is opened at a period of time after the slave(S) latch 404 is opened that is equal to the second delay. Advantageously, this allows for formation of a transparency window without degrading the timing of the third data path P3 because the third data path P3 is critical and does not have the slack to provide to the second data path P2.

On the other hand at operation 506, if the static timing analysis application determines that delaying the CLKM signal of the second flip-flop FF2 by any amount of time would violate a hold requirement of the second flip-flop FF2 or that the IC 100 is sensitive, the CLKM signal is not delayed, and neither of the configuration signals (cfg_dly1 and cfg_dly2) are enabled.

On the other hand, if the static timing analysis application determines that the third data path is not critical (operation 504), at operation 508, the static timing analysis software determines if the second data path P2 can borrow time without violating a hold requirement the second flip-flop FF2. For example, the static timing analysis software determines if the second data path P2 can borrow an amount of time between 0 and the maximum latency of the CLK signal without violating a hold requirement of the second flip-flop FF2. If the static timing analysis application determines that borrowing time would violate a hold of the second flip-flop FF2, the method proceeds to operation 514 and neither of the configuration signals (cfg_dly1 and cfg_dly2) are enabled.

On the other hand, if the static timing analysis application determines that the second data path P2 borrowing time would not violate a hold requirement of the second flip-flop FF2, the method 500 proceeds to operation 518 and the static timing analysis application determines whether the IC is sensitive.

In one or more examples, the static timing analysis application can determine that the IC 100 is sensitive if the IC 100 is sensitive to glitches or propagates glitches that impact functionality. In another example, the IC 100 is sensitive if changes in circuit design parameters change the quality of operations of the IC 100. For example, if adding a delay changes the quality of the operations of the IC 100, the IC is sensitive. In one example, the static timing analysis application may use thresholds or test data to determine whether the IC 100 is sensitive to glitches or propagates glitches that impact functionality.

At operation 518 of the method 500, the static timing analysis application determines whether the IC 100 is sensitive. As noted above, the static timing analysis application can determine if the IC 100 is sensitive if the IC 100 is sensitive to glitches or propagates glitches that impact functionality.

If the static timing analysis application determines that the IC 100 is sensitive, the method 500 proceeds to operation 520 and the static timing analysis application enables the first configuration signal cfg_dly1 of the second flip-flop FF2 and sets the first delay equal to (i.e., generates a delayed CLKS signal) the largest amount of time between 0 and the maximum latency of the CLK signal that can be borrowed by the second data path P2 without violating the hold requirement of the second flip-flop FF2 via the first delay control signal dly_crtl1. Advantageously, this configures the second flip-flop FF2 to behave as a time-shifted flip-flop.

On the other hand, if the static timing analysis software determines that the IC 100 is not sensitive, the method 500 proceeds to operation 522 and the first configuration signal cfg_dly1 and the second configuration signal cfg_dly2 of the second flip-flop are both enabled. The static timing analysis application also sets the second delay equal to U and sets the first delay equal to the largest possible amount of time that can be borrowed without violating the hold requirement of the second flip-flop FF2 minus U.

For example, if the second data path P2 can borrow time and the IC 100 is not sensitive, the static timing analysis application can enable both the first configuration signal cfg_dly1 and the second configuration signal cfg_dly2, and set the first and second delays, causing the second flip-flop FF2 (if the hold requirement is not violated) to behave as both a soft-edge flip-flop and a master-slave time borrowing flip-flop. For example, the static timing analysis software sets the second delay so that he CLKM signal is delayed by a length of time equal to U and sets the first delay so that the CLKS signal is delayed by a length of time equal the largest possible amount of borrowable time minus U. Here, the CLKM signal is still delayed by a length of time equal to U which allows for a transparent window equal to the length of U. Advantageously, this allows recovery of the additional pessimism (equal to U) and skews the clock from the earliest clock arrival time to the D-pin of the second flip-flop FF2 which allows the second data path P2 to be further credited without additionally degrading the slack of the third data path P3.

In one or more examples, the static timing analysis application determines may perform method 500 on each register included in the IC 100. In one or more examples, the CLK MOD circuitry 105 may include a delay hierarchy circuitry 106 that configures each register individually or a single delay hierarchy circuitry 106.

What is claimed is:

1. An integrated circuit (IC) comprising:
a register;
a clock modulation circuitry including a delay hierarchy circuitry coupled to the register, the delay hierarchy circuitry configured to:
receive a clock (CLK) signal;
provide a delayed master clock (CLKM) signal to a master latch of the register; and
provide a delayed slave clock (CLKS) signal to a slave latch of the register, wherein the delay hierarchy circuitry further comprises:
a first delay circuit configured to receive the CLK signal, add a first delay to the CLK signal, and output a first delayed clock signal; and
a first delay control circuitry configured to receive the first delayed clock signal and the CLK signal and output a first delay control circuitry output signal comprising either the CLK signal or the first delayed clock signal as the CLKS signal to the slave latch and to a second delay circuit based on characteristics of the IC, the second delay circuit configured to add a second delay to the first delay control circuitry output signal and output a second delayed clock signal.

2. The IC of claim 1, wherein the delay hierarchy circuitry is further configured to:

selectively provide the delayed CLKM signal to the master latch of the register based on a hold requirement of the register; and
selectively provide the delayed CLKS signal to the slave latch of the register based on characteristics of the IC.

3. The IC of claim 1, wherein the delay hierarchy circuitry further comprises:
a second delay control circuitry configured to receive the first delay control circuitry output signal and the second delayed clock signal, and output either the first delay control circuitry output signal or the second delayed clock signal as the CLKM signal to the master latch of the register based on the characteristics of the IC.

4. The IC of claim 3, wherein the first delay control circuitry is configured to output the CLK signal as the first delay control circuitry output signal and the second delay control circuitry is configured to output the second delayed clock signal as the CLKM signal if a data path of the IC starting at an output pin of the register is critical and there is an amount of clock uncertainties that can be recovered without violating a hold requirement of the register, wherein the second delay is set to a largest possible amount of clock uncertainties that can be recovered.

5. The IC of claim 3, wherein the first delay control circuitry is configured to output the first delayed clock signal as the first delay control circuitry output signal and second delay control circuitry is configured to output the second delayed clock signal as the CLKM signal if a data path of the IC starting at an output pin of the register includes slack, the data path can borrow an amount of time that does not violate a hold requirement of the register, and the IC is not sensitive, wherein the first delay is set to a largest amount of time that can be borrowed without violating the hold requirement of the register minus a largest possible amount of clock uncertainties (U), and the second delay is set to U.

6. The IC of claim 3, wherein the first delay control circuitry is configured to output the first delayed clock signal as the first delay control circuitry output signal and the second delay control circuitry is configured to output the first delayed clock signal as the CLKM signal if a data path of the IC having a start point at an output pin of the register includes slack, the data path can borrow an amount of time that does not violate a hold requirement of the register, and the IC is sensitive, wherein the first delay is set to a largest amount of time that can be borrowed without violating the hold requirement.

7. The IC of claim 3, wherein the first delay control circuitry is configured to output the CLK signal as the first delay control circuitry output signal and the second delay control circuitry is configured to output the first delay control circuitry output signal as the CLKM signal if a data path of the IC starting at an output pin of the register includes slack and the data path cannot borrow an amount of time without violating a hold requirement of the register.

8. The IC of claim 3, wherein the first delay control circuitry is configured to output the CLK signal as the first delay control circuitry output signal and the second delay control circuitry is configured to output the first delay control circuitry output signal as the CLKM signal if a data path of the IC having a start point at an input pin of the register is critical, and there is not an amount of clock uncertainties that can be recovered without violating a hold requirement of the register.

9. The IC of claim 3, wherein the first delay is set based on a first delay control signal and the second delay is set based on a second delay control signal.

10. A method for modulating a clock (CLK) signal of an integrated circuit (IC) comprising:

receiving, by a delay hierarchy circuitry of a clock modulation circuitry, the CLK signal;

providing, by the delay hierarchy circuitry, a delayed master clock (CLKM) signal to a master latch of a register of the IC;

providing, by the delay hierarchy circuitry, a delayed slave clock (CLKS) signal to a slave latch of the register;

receiving, by a first delay circuit of the delay hierarchy circuitry, the CLK signal;

generating, by the first delay circuit, a first delayed clock signal by adding a first delay to the CLK signal;

receiving, by a first delay control circuitry, the first delayed clock signal and the CLK signal; and outputting, by the first delay control circuitry, a first delay control circuitry output signal comprising either the first delayed clock signal or the CLK signal as the CLKS signal to the slave latch and to a second delay circuit based on characteristics of the IC.

11. The method of claim 10, further comprising:

selectively providing, by the delay hierarchy circuitry, the delayed CLKM signal to the master latch of the register based on a hold requirement of the register; and selectively providing, by the delay hierarchy circuitry, the delayed CLKS signal to the slave latch of the register based on at least a criticality of a data path of the IC having a start point at an output pin of the register.

12. The method of claim 10 further comprising:

generating, by the second delay circuit, a second delayed clock signal by adding a second delay to the first delay control circuitry output signal;

receiving, a second delay control circuitry, the second delayed clock signal and the first delay control circuitry output signal; and outputting, by the second delay control circuitry, either the first delay control circuitry output signal or the second delayed clock signal as the CLKM signal to the master latch of the register based on the characteristics of the IC.

13. The method of claim 12, wherein:

the first delay control circuitry outputs the first delayed clock signal as the first delay control circuitry output signal and the second delay control circuitry outputs the second delayed clock signal as the CLKM signal if a data path of the IC starting at an output pin of the register includes slack, there is an amount of time that the data path can borrow without violating a hold requirement of the register, and the IC is not sensitive, wherein the first delay is set to a largest amount of time that can be borrowed without violating the hold requirement of the register minus a largest possible amount of clock uncertainties (U), and the second delay is set to U.

14. The method of claim 12, wherein:

the first delay control circuitry outputs the CLK signal as the first delay control circuitry output signal and the second delay control circuitry outputs the second delayed clock signal as the CLKM signal if a data path of the IC starting at an output pin of the register is critical, and there is an amount of clock uncertainties that can be recovered without violating a hold requirement of the register, wherein the first delay is set to a largest possible amount of amount of clock uncertainties that can be recovered without violating the hold requirement of the register.

15. The method of claim 12, wherein:

the first delay control circuitry outputs the first delayed clock signal as the first delay control circuitry output signal and the second delay control circuitry outputs the first delay control circuitry output signal as the CLKM if a data path of the IC starting at an output pin of the register includes slack, there is an amount of time that can be borrowed without violating a hold requirement of the register, and the IC is sensitive, wherein the first delay is set to a largest possible amount of time that can be borrowed without violating a timing requirement of the register.

16. The method of claim 12, wherein the first delay control circuitry outputs the CLK signal as the first delay control circuitry output signal and the second delay control circuitry outputs the first delay control circuitry output signal as the CLKM if a data path of the IC starting at an output pin of the register includes slack and there is not an amount of time that can be borrowed without violating a hold requirement of the register.

17. The method of claim 12, wherein the first delay control circuitry outputs the CLK signal as the first delay control circuitry output signal and the second delay control circuitry outputs the first delay control circuitry output signal as the CLKM if a data path of the IC starting at an output pin of the register is critical and there is not an amount of clock uncertainties that can be recovered without violating a hold requirement of the register.

\* \* \* \* \*